United States Patent
Saha et al.

(10) Patent No.: US 6,924,647 B2
(45) Date of Patent: Aug. 2, 2005

(54) FAULT LOCATION METHOD AND DEVICE

(75) Inventors: Murari Saha, Västerås (SE); Eugeniusz Rosolowski, Wroclaw (PL); Jan Izykowski, Wroclaw (PL)

(73) Assignee: ABB AB, Västerås (SE)

( * ) Notice: Subject to any disclaimer, the term of this patent is extended or adjusted under 35 U.S.C. 154(b) by 0 days.

(21) Appl. No.: 10/450,655

(22) PCT Filed: Dec. 14, 2001

(86) PCT No.: PCT/SE01/02771
§ 371 (c)(1),
(2), (4) Date: Dec. 2, 2003

(87) PCT Pub. No.: WO02/48725
PCT Pub. Date: Jun. 20, 2002

(65) Prior Publication Data
US 2004/0169518 A1 Sep. 2, 2004

(30) Foreign Application Priority Data
Dec. 14, 2000 (SE) ............................................. 0004627

(51) Int. Cl.$^7$ .......................... G01R 31/08; G06F 19/00
(52) U.S. Cl. ............................ 324/512; 702/59; 361/80
(58) Field of Search ............................ 324/509–512; 361/80–82; 702/57–59

(56) References Cited

U.S. PATENT DOCUMENTS

| | | | | |
|---|---|---|---|---|
| 4,325,098 A | * | 4/1982 | Heller | ......................... 361/82 |
| 4,559,491 A | | 12/1985 | Saha | ......................... 324/522 |
| 5,839,093 A | * | 11/1998 | Novosel et al. | ................ 702/59 |
| 6,584,417 B1 | * | 6/2003 | Hu et al. | ......................... 702/58 |

FOREIGN PATENT DOCUMENTS

| | | |
|---|---|---|
| GB | 2164712 | 3/1986 |
| GB | 2320299 | 6/1998 |
| GB | 2340561 | 2/2000 |
| GB | 2340562 | 2/2000 |
| GB | 2340563 | 2/2000 |

OTHER PUBLICATIONS

M.S. Sachdev et al., A Technique for Estimating Transmission Line Fault Locations from Digital Impedance Relay Measurements, IEEE Transactions on Power Delivery, vol. 3, No. 1, Jan. 1988, pp. 121–129.

M.S. Sachdev et al., Accurate Fault–Location Estimates from Digital Impedance Relay Measurements, Proceedings of Third International Conference on Developments in Power System Protection, London, Apr. 17–19, 1985, Conference Publication No. 249, pp. 180–184.

* cited by examiner

Primary Examiner—Vincent Q. Nguyen
(74) Attorney, Agent, or Firm—Venable LLP; Eric J. Franklin

(57) ABSTRACT

The present invention relates to a method for calculating the distance to fault in a section of a power transmission network, which section is arranged with line terminals at both ends, each terminal including impedance relays (AA, BB), including the steps of, at the occurence of a fault; measuring the apparent impedances by each relay, measuring the relaying currents, determining the type of fault, checking whether the fault involves a fault resistance or not, and, if so, solving a quadratic equation for complex numbers, resolving the quadratic equation for the real and imaginary components, obtaining two quadratic equations for a fault distance in which the coefficients are real numbers, combining the two equations and obtaining a distance to fault, or, if not so, solving a quadratic equation for real numbers, obtaining two solutions for the distance to fault $d_1$, $d_2$ and comparing the solutions as $0<(d_1$ or $d_2)<1$ pu, where pu is the length of transmission lines between the line terminals.

6 Claims, 13 Drawing Sheets

- (a-b-g) fault:

- (a-b-c) or (a-b-c-g) symmetrical faults:

FAULT LOCATION METHOD AND DEVICE

This application is a 371 of PCT/SE01/02771 filed on Dec. 14, 2001.

TECHNICAL FIELD

The present invention relates to fault location technique for a section of power transmission lines utilizing measurements of impedance relays installed at both line terminals.

BACKGROUND OF INVENTION

The following signals from impedance relays can, in general, be applied for fault location: phasors and/or amplitudes of relaying currents/voltages, which are composed for measurement of apparent impedance of fault loops, phasors of particular sequence components of phase currents and voltages, and measured apparent impedances of fault loops "seen" from the line terminals.

Utilization of measurements from impedance relays for fault location has been initiated by M. Sachdev and Agarwal in the papers "Accurate fault location estimates from digital impedance relay measurements," Proceedings of Third International Conference on Developments in Power System Protection, London, 17–19 Apr. 1985, Conference Publication No. 249, pp 180–184 (paper [1]) and "A technique for estimating transmission line fault locations from digital impedance relay measurements," IEEE Transaction on Power Delivery, Vol. 3, No. 1, January 1988, pp 121–129 (paper [2]). Their method uses the following measurements from impedance relays installed at both the line terminals:

for single phase-to-ground faults: apparent impedances of fault loops, phasors of relaying currents and phasors of a zero sequence current, for the other fault types: apparent impedances of fault loops, phasors of a positive and a negative sequence currents.

The method presented in papers [1–2] uses Cartesian description of the relations between the input data for different fault types. In consequence, in papers [1–2] a rather complex fault location algorithm is obtained. The algorithm contains 28 steps to be performed in a sequence dependent on a fault type.

In the method of the papers [1–2] the synchronization angle is required to be calculated. The calculations of the synchronization angle proposed in papers [1–2] are based on solving a quadratic equation for the unknown angle. As always for quadratic equations, two solutions are obtained. A specific one of them is taken further. Generally this provides the correct fault location in huge majority of the cases. However, there is no proof in papers [1–2] that this works correctly in complex configurations of transmission networks and different specifications of a fault. Further, the algorithm of the papers [1–2] is derived for a single line only, and subsequently can not handle parallel lines.

BRIEF DESCRIPTION OF INVENTION

The aim of the present invention is to remedy the above mentioned problems.

This is obtained by a method characterised by claim 1. Specific features of the present invention are characterised by the appending claims.

The method according to the present invention substantially differs from the method according to papers [1–2] with respect to the utilized input data, namely less input data is required than the above specified data for the method of papers [1–2]. The method according to the present invention utilizes the following information from impedance relays installed at both the line ends:

apparent impedances measured from the relaying voltages and currents, amplitudes of relaying currents.

It is to be understood that the above listed quantities are by nature not related to the synchronization angle. This is in contrast to the input data of the method according to papers [1–2] where the unknown synchronization angle is required for in calculations.

The advantages of the method according to the present invention can be summarised as follows:

The applied input data (apparent impedances of fault loop signals and amplitudes of relaying currents) in the present invention is characterized by no involvement of a synchronization angle at all as these signals are by nature not dependent on this angle.

The method according to the invention utilizes generalized description of a fault and in consequence the developed fault location algorithm is of compact form, i.e. the algorithm is the same for all fault types and only one coefficient having a fixed value depends on fault type, A unique solution for a distance to fault is always provided, regardless of the transmission network parameters and specifications of the fault. Thus, the algorithm can be applied for lines working in complex networks. For example, the series-compensated transmission networks are considered as complex grids—for which providing a completely unique solution is especially desired. In this respect, the proposed fault location algorithm can be easily adapted for such applications, giving the unique solution.

The method is suitable for both a single line as well as for parallel transmission lines. The algorithm is the same in principle for both the applications. The difference is inside a protective relay itself, where the fault loop current is composed of somewhat different elements depending on whether it is a single line or parallel lines arrangement. In the case of parallel lines the fault loop current includes additional elements, taking into account the mutual coupling between the parallel lines for the zero sequence. Thus, the difference is only with respect to the way of obtaining the input data of the fault location algorithm (what is performed in a relay itself) but not for the fault location algorithm itself. The algorithm according to papers [1–2] is derived for a single line only while the proposed method suits for both, a single and parallel lines.

The proposed method is intended for use in post-fault analysis aimed at verification of operation of distance relays.

These and other aspects of the present invention and advantages with it will become apparent from the detailed description and from the accompanying drawings.

BRIEF DESCRIPTION OF THE DRAWINGS

In the following detailed description of the invention, reference will be made to the accompanying drawings, of which.

DETAILED DESCRIPTION OF THE INVENTION

The fault location algorithm according to the present invention is capable locating faults in both single and parallel transmission lines. However, derivation of the algorithm is presented for parallel lines, FIG. 1, which is a more general case.

In case of a fault on a protected line a distance relay trips the associated circuit breaker. The decision is issued on the base of the performed impedance measurement. Apparent impedance "seen" by a relay can be determined with varieties of impedance algorithms. Here, it is considered that the impedance is determined by processing phasors of the fault loop signals: the voltage ($\underline{V}_{AA\_p}$—for a relay AA, $\underline{V}_{BA\_p}$—for a relay BA) and the current ($\underline{I}_{AA\_p}$—for a relay AA, $\underline{I}_{BA\_p}$—for a relay BA), which are composed according to the fault type. Table 1 gathers the fault loop signals, when using the traditional description and with applying the symmetrical components notation.

TABLE 1

Fault loop signals formed by a distance relay for different fault types

| Fault type | Traditional description of the fault loop signals | | Description of the fault loop signals with use of symmetrical quantities $\underline{V}_{AA\_p} = \underline{a}_1 \underline{V}_{AA1} + \underline{a}_2 \underline{V}_{AA2} + \underline{a}_0 \underline{V}_{AA0}$ $\underline{I}_{AA\_p} = \underline{a}_1 \underline{I}_{AA1} + \underline{a}_2 \underline{I}_{AA2} + \underline{a}_0 \frac{\underline{Z}_{0L}}{\underline{Z}_{1L}} \underline{I}_{AA0} + \underline{a}_{0m} \frac{\underline{Z}_{0m}}{\underline{Z}_{1L}} \underline{I}_{AB0}$ | | |
|---|---|---|---|---|---|
| | Fault loop voltage: $\underline{V}_{AA\_p}$ | Fault loop current: $\underline{I}_{AA\_p}$ | $\underline{a}_1$ | $\underline{a}_2$ | $\underline{a}_0$ |
| a-g | $\underline{V}_{AAa}$ | $\underline{I}_{AAa} + \underline{k}_0 \underline{I}_{AA0} + \underline{k}_{0m} \underline{I}_{AB0}$ | 1 | 1 | 1 |
| b-g | $\underline{V}_{AAb}$ | $\underline{I}_{AAL2} + \underline{k}_0 \underline{I}_{AA0} + \underline{k}_{0m} \underline{I}_{AB0}$ | $a^2$ | $a$ | 1 |
| c-g | $\underline{V}_{AAc}$ | $\underline{I}_{AAc} + \underline{k}_0 \underline{I}_{AA0} + \underline{k}_{0m} \underline{I}_{AB0}$ | $a$ | $a^2$ | 1 |
| a-b a-b-g a-b-c a-b-c-g | $\underline{V}_{AAa} - \underline{V}_{AAb}$ | $\underline{I}_{AAa} - \underline{I}_{AAb}$ | $1 - a^2$ | $1 - a$ | 0 |
| b-c b-c-g | $\underline{V}_{AAb} - \underline{V}_{AAc}$ | $\underline{I}_{AAb} - \underline{I}_{AAc}$ | $a^2 - a$ | $a - a^2$ | 0 |
| c-a c-a-g | $\underline{V}_{AAc} - \underline{V}_{AAa}$ | $\underline{I}_{AAc} - \underline{I}_{AAa}$ | $a - 1$ | $a^2 - 1$ | 0 |

$$a = \exp\left(j\frac{2\pi}{3}\right)$$

$$\underline{k}_0 = \frac{\underline{Z}_{0L} - \underline{Z}_{1L}}{\underline{Z}_{1L}},$$

$$\underline{k}_{0m} = \frac{\underline{Z}_{0m}}{\underline{Z}_{1L}},$$

Figure 2:
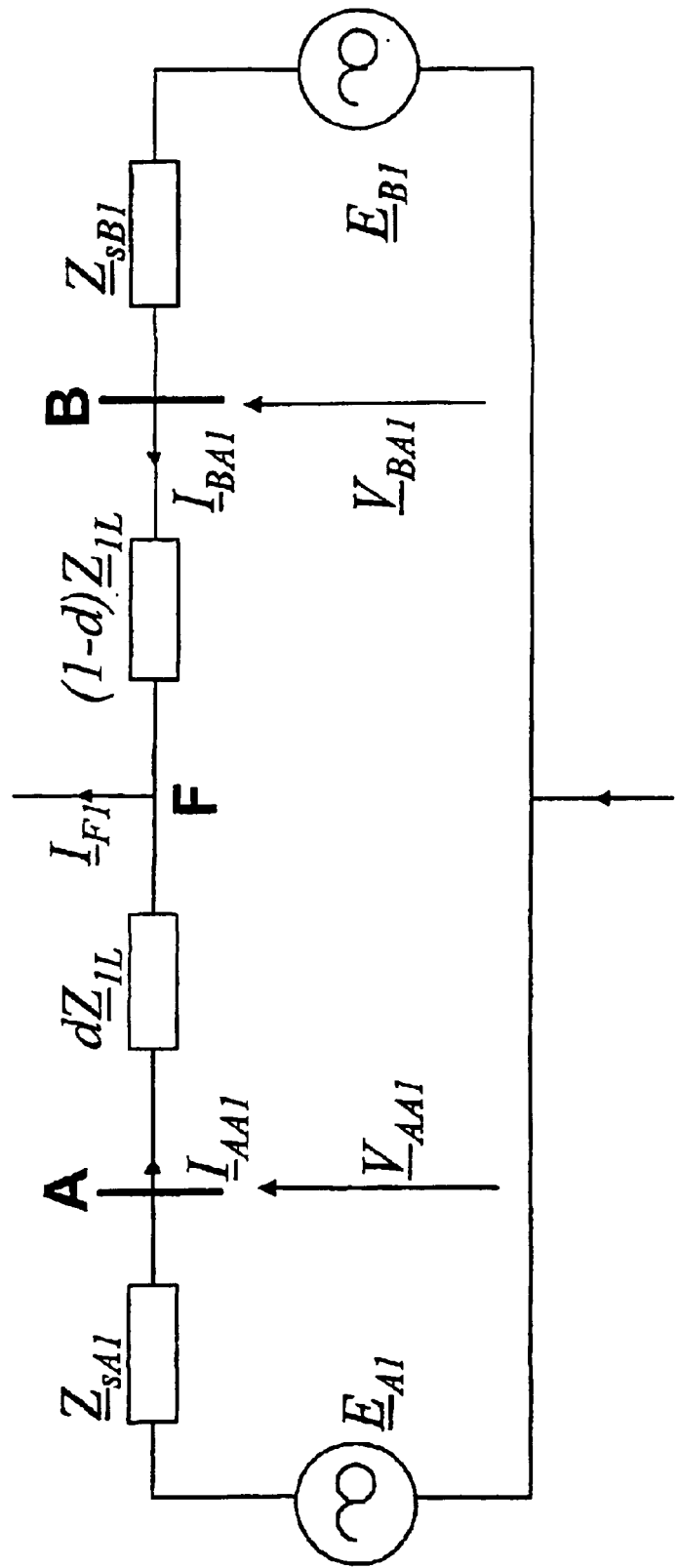
FIG. 2 shows a model of a two terminal transmission line for the positive sequence.
Figure 3:
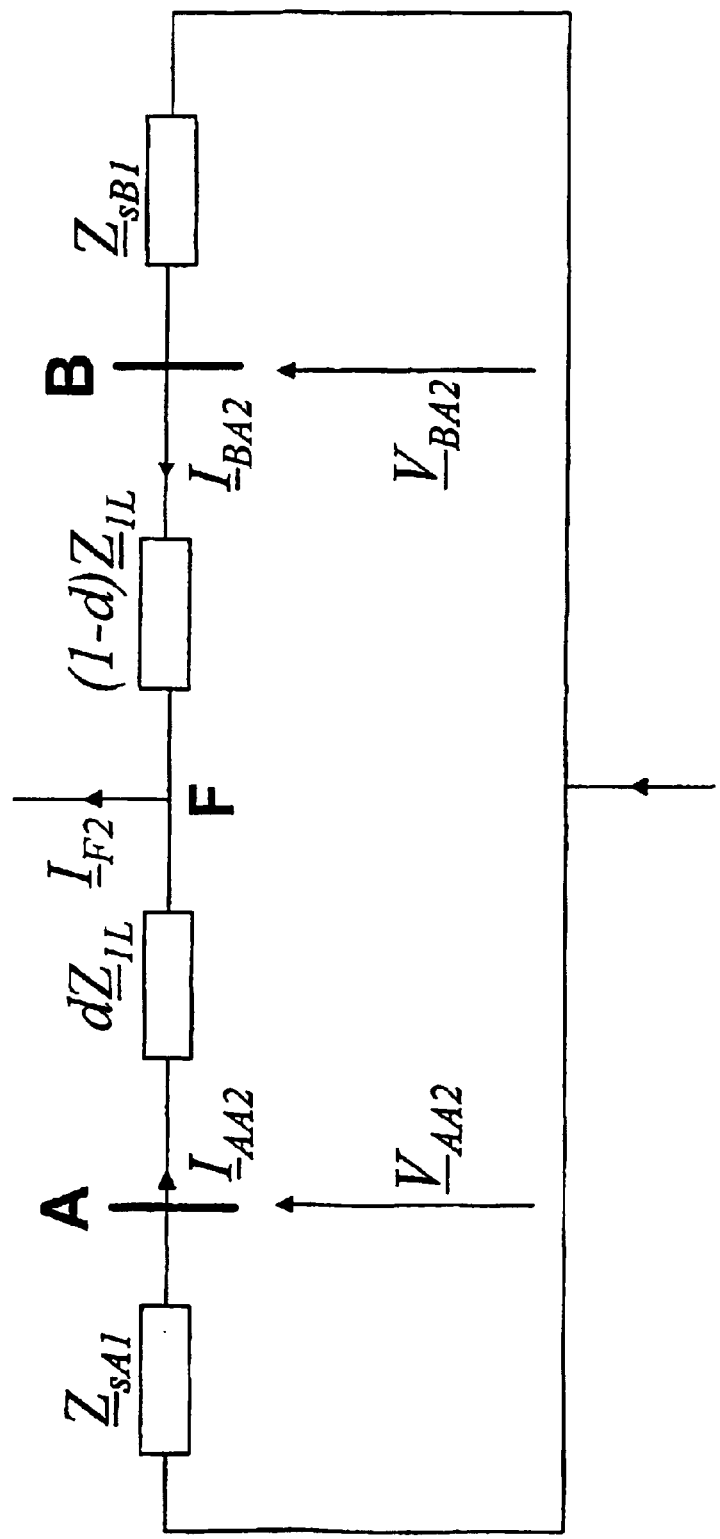
FIG. 3 shows a model of a two terminal transmission line for the negative sequence.
Figure 4:
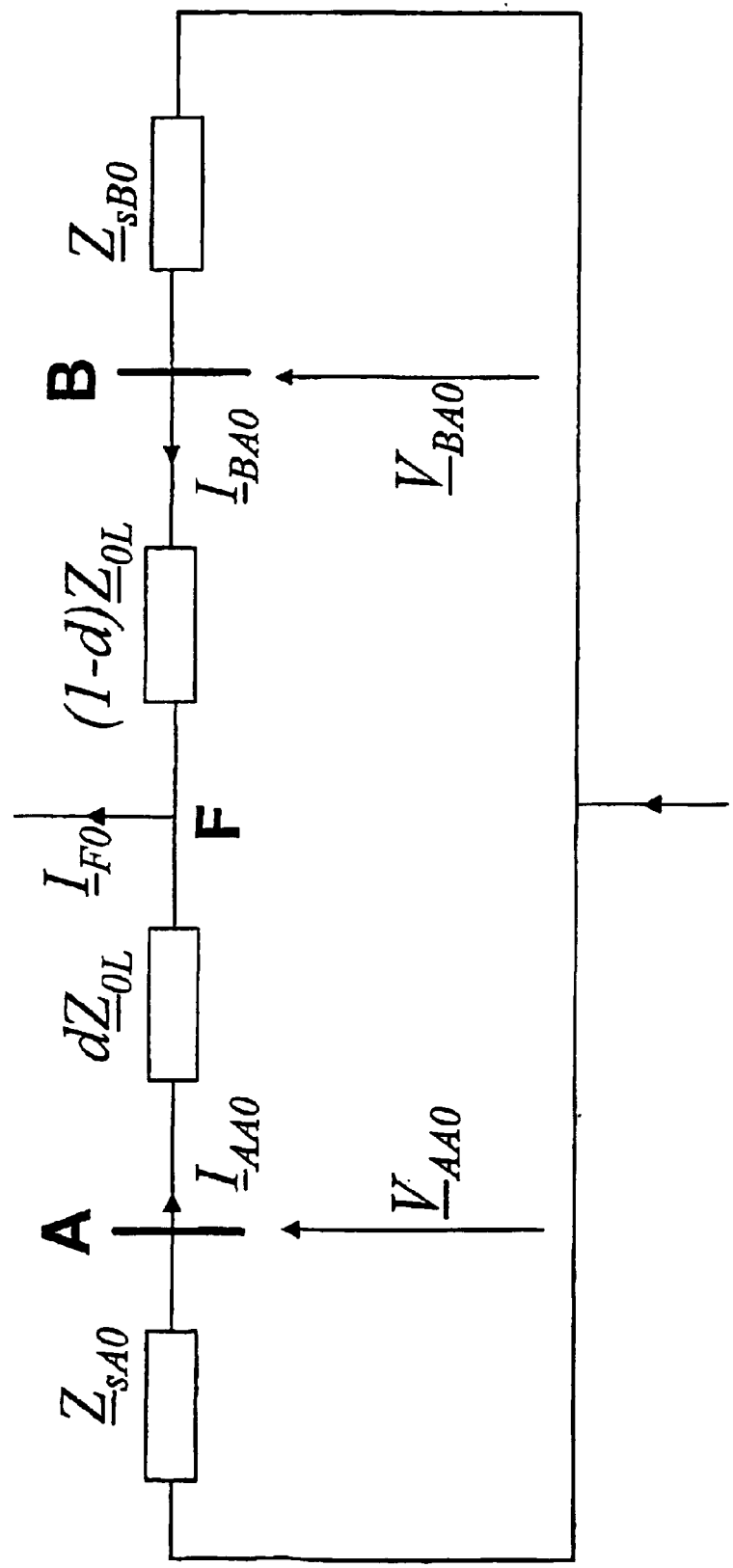
FIG. 4 shows a model of a two terminal transmission line for zero sequence.

$\underline{a}_{0m} = 0$ – for a single line, $\underline{a}_{0m} = \underline{a}_0$ – for parallel lines The latter description of the signals is utilized for deriving the presented fault location algorithm. The circuit diagrams for a single line are shown in FIGS. 2–4, where FIG. 2 shows the positive sequence, FIG. 3 shows the negative sequence and FIG. 4 shows the zero sequence, and for parallel lines in FIGS. 5–7.

Figure 5:
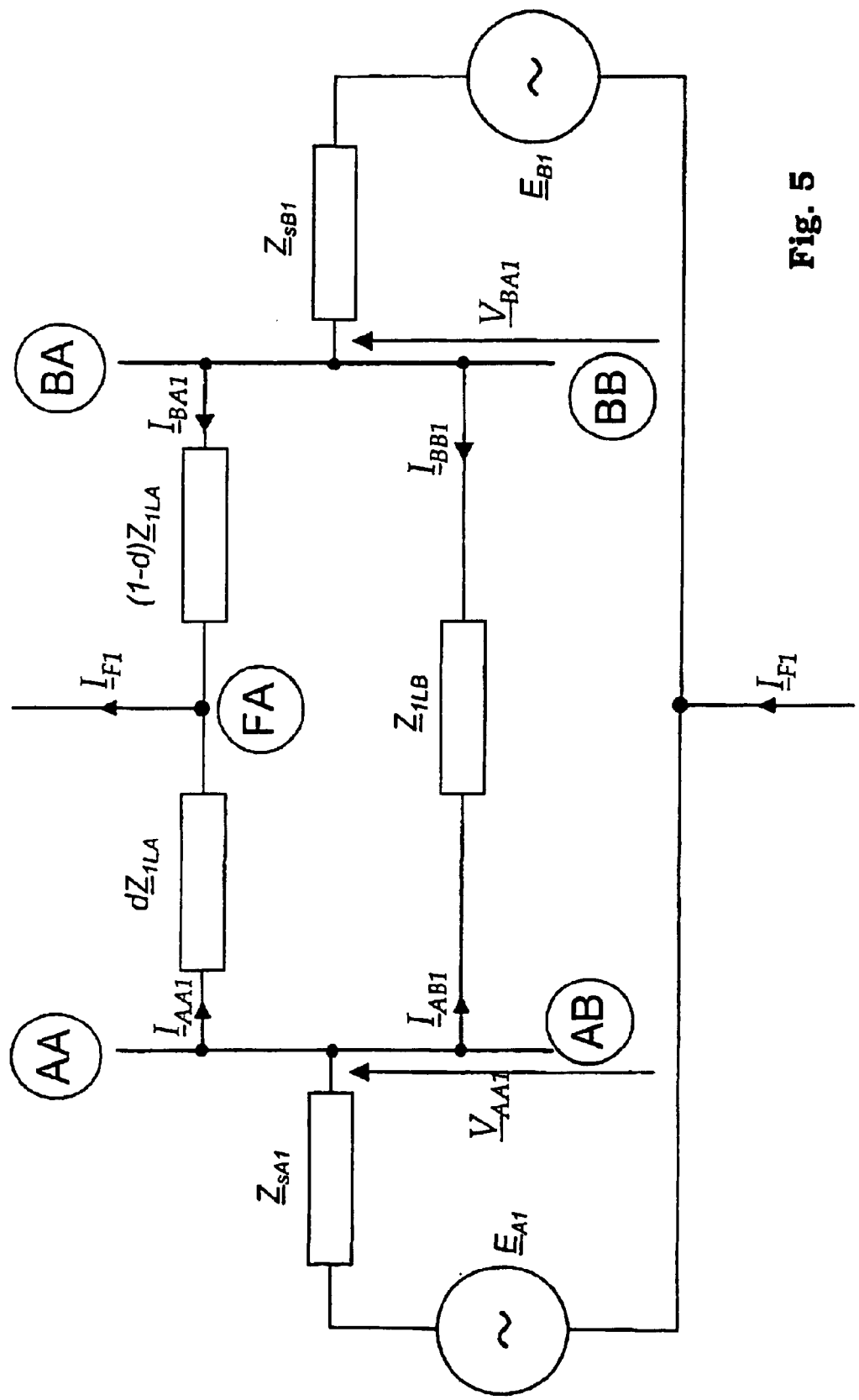
FIG. 5 shows a positive sequence network for parallel lines.
Figure 6:
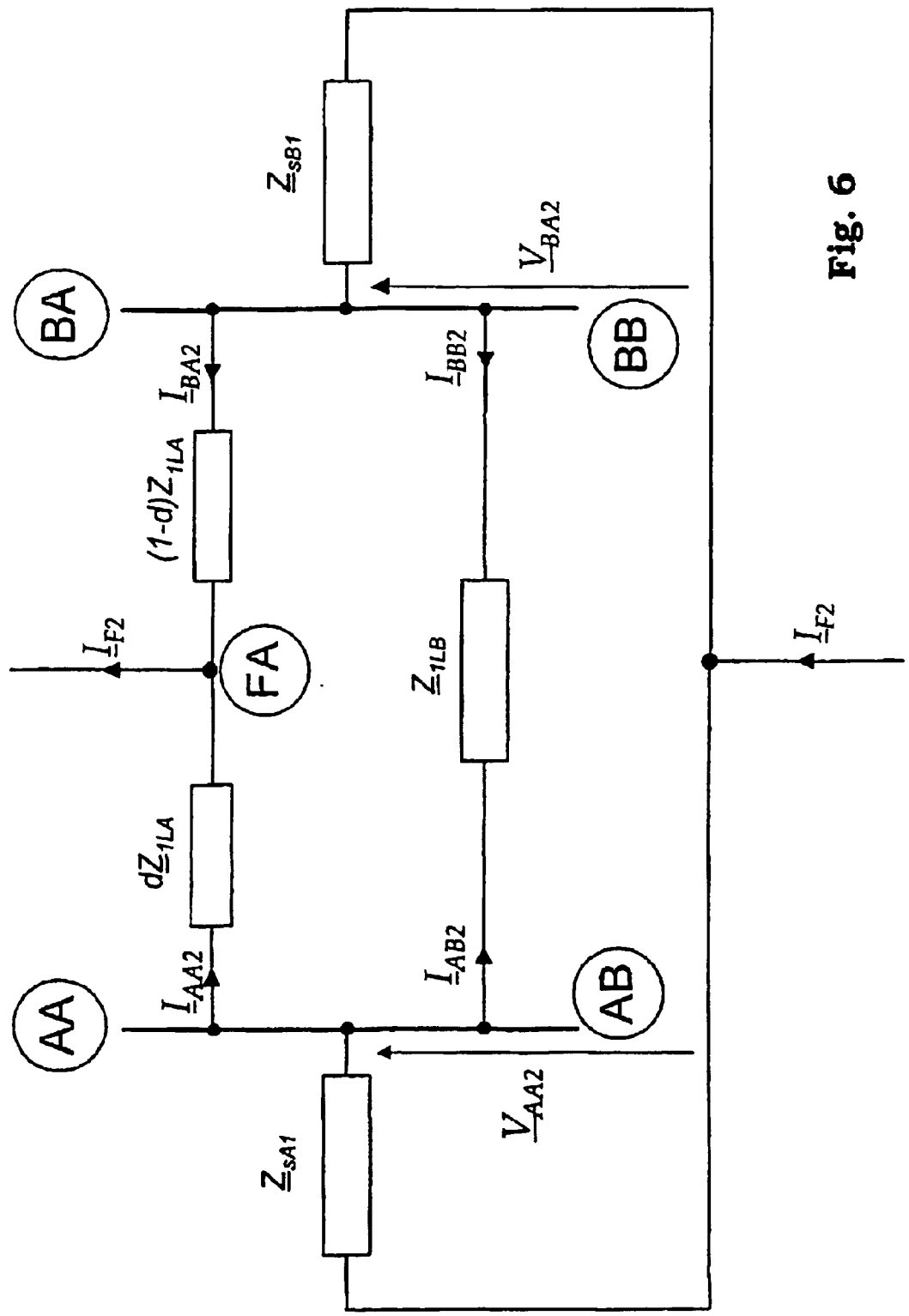
FIG. 6 shows a negative sequence network of parallel lines.
Figure 7:
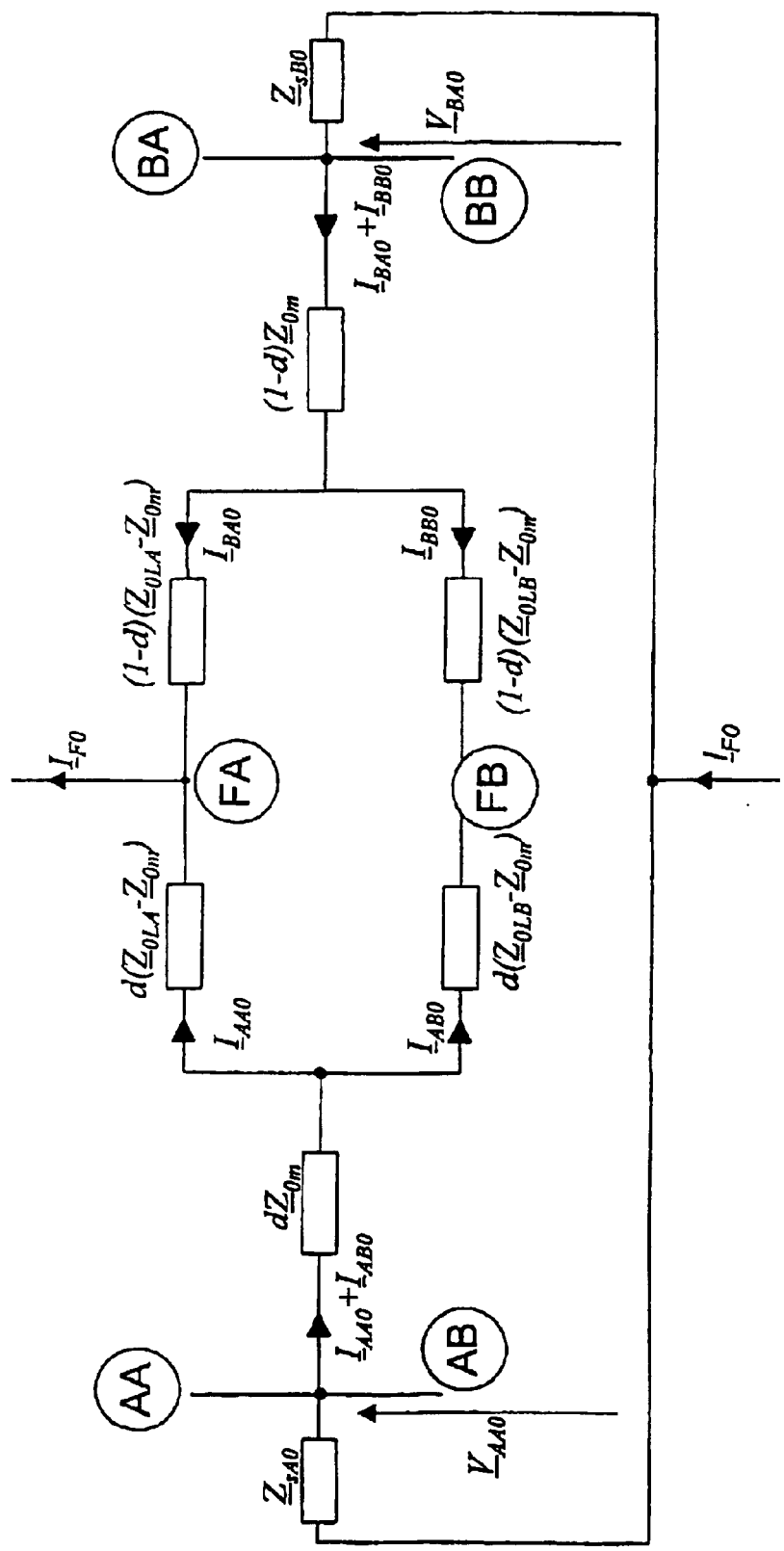
FIG. 7 shows a zero sequence network of parallel lines.

FIG. 5 shows the positive network, FIG. 6 shows the negative network while FIG. 7 presents the zero sequence circuit for parallel lines. Note that there are no sources for both the negative and zero sequence components since the lines supply is assumed as three phase fully symmetrical. It is considered that the impedances for the negative sequence are equal to the respective impedances for the positive sequence.

In case of parallel lines it is further assumed that the impedances of both the parallel lines for particular sequences are identical $$(\underline{Z}_{1LA}=\underline{Z}_{1LB}=\underline{Z}_{1L}; \underline{Z}_{0LA}=\underline{Z}_{0LB}=\underline{Z}_{0L}).$$

Figure 1:
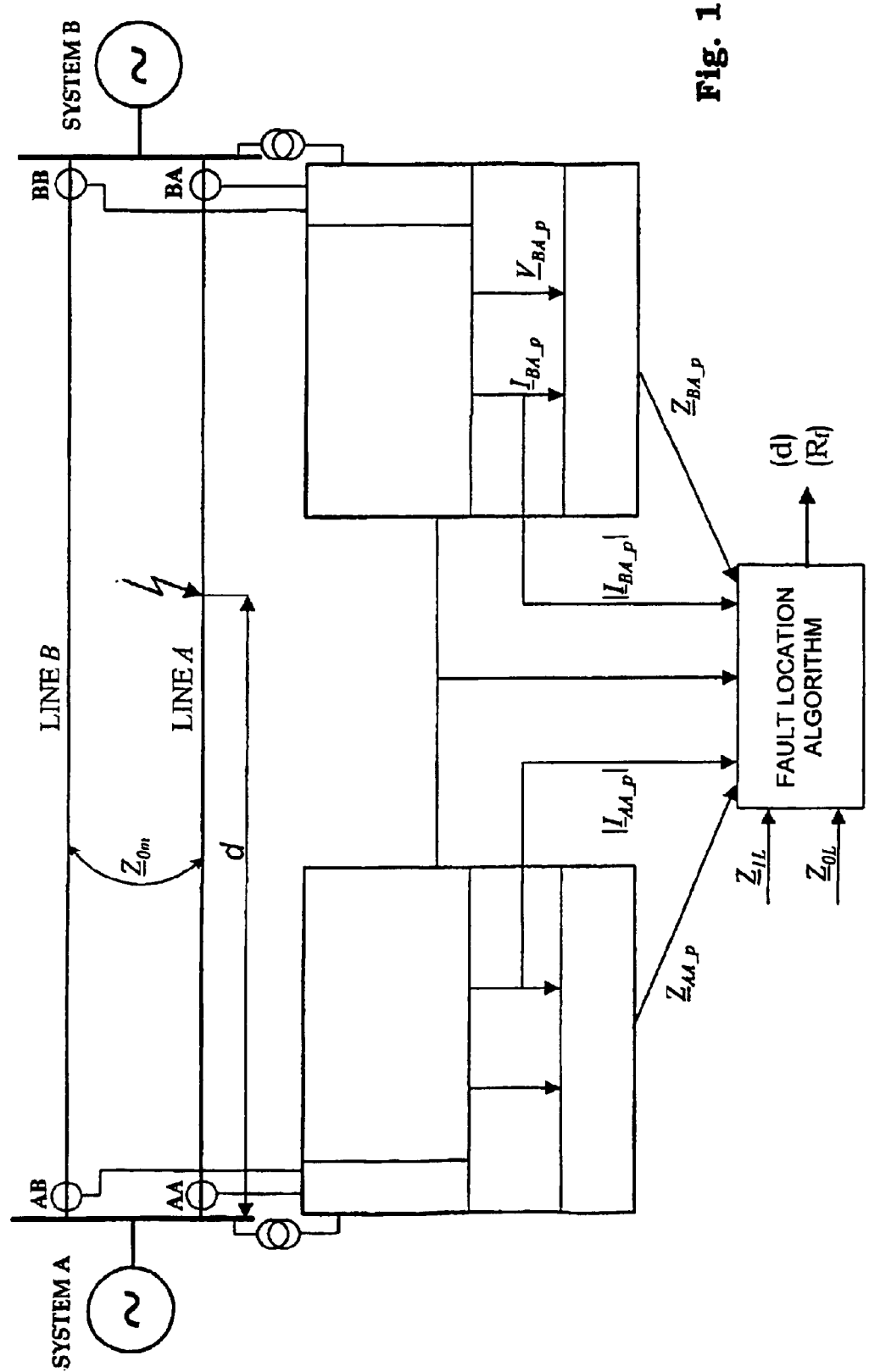
FIG. 1. shows a schematic diagram for fault location based on measurements of distance relays at the line terminals.

Using the sequence quantities for description of the fault loop signals one obtains for the protective relay AA, which protects the LINE A, FIG. 1:

$$\underline{V}_{AA\_p}=\underline{a}_1\underline{V}_{AA1}+\underline{a}_2\underline{V}_{AA2}+\underline{a}_0\underline{V}_{AA0} \tag{1}$$

$$\underline{I}_{AA\_p} = \underline{a}_1 \underline{I}_{AA1} + \underline{a}_2 \underline{I}_{AA2} + \underline{a}_0 \frac{\underline{Z}_{0L}}{\underline{Z}_{1L}} \underline{I}_{AA0} + \underline{a}_{0m} \frac{\underline{Z}_{0m}}{\underline{Z}_{1L}} \underline{I}_{AB0} \tag{2}$$

where:

$\underline{V}_{AA1}$, $\underline{V}_{AA2}$, $\underline{V}_{AA0}$—positive, negative and zero sequence components of measured phase voltages, $\underline{I}_{AA1}$, $\underline{I}_{AA2}$, $\underline{I}_{AA0}$—positive, negative and zero sequence components of measured phase currents from the faulted line (LINE A), $\underline{I}_{AB0}$—zero sequence component of phase currents from the healthy line (LINE B), $\underline{a}_1$, $\underline{a}_2$, $\underline{a}_0$, $\underline{a}_{0m}$—complex coefficients dependent on a fault type (Table 1), $\underline{Z}_{1L}$—impedance of a whole line for the positive sequence, $\underline{Z}_{0L}$—impedance of a whole line for the zero sequence, $\underline{Z}_{0m}$—zero sequence impedance for the mutual coupling between the lines.

In all further considerations it is assumed that a time basis of measurements from the relay BA is taken as a reference. As the measurements of both relays (AA and BA) are not synchronous, the measurements of a relay AA are taken with including the unknown synchronization angle ($\delta$).

Neglecting shunt capacitances of a line, the fault loop which is "seen" by the protective relay AA can be described with the following voltage equation:

$$\underline{V}_{AA\_p}e^{j\delta}-d\underline{Z}_{1L}\underline{I}_{AA\_p}e^{j\delta}-R_F(\underline{a}_{F1}\underline{I}_{F1}+\underline{a}_{F2}\underline{I}_{F2}+\underline{a}_{F0}\underline{I}_{F0})=0 \tag{3}$$

where:

d—distance to a fault, $\delta$—synchronization angle, $R_F$—fault resistance, $\underline{I}_{F1}$, $\underline{I}_{F2}$, $\underline{I}_{F0}$—positive, negative and zero sequence components of the fault paths currents, $\underline{a}_{F1}$, $\underline{a}_{F2}$, $\underline{a}_{F0}$—positive, negative and zero sequence weighting coefficients dependent on the fault type (Table 2), An analogous formula is obtained for the protective relay BA installed at the remote substation (note: there is no synchronization angle here as these measurements are taken as the reference):

$$\underline{V}_{BA\_p}-(1-d)\underline{Z}_{1L}\underline{I}_{BA\_p}-R_F(\underline{a}_{F1}\underline{I}_{F1}+\underline{a}_{F2}\underline{I}_{F2}+\underline{a}_{F0}\underline{I}_{F0})=0 \tag{4}$$

Combining equations (3) and (4) results in:

$$I_{AA\_p}e^{j\delta} + I_{BA\_p} - R_F(\underline{a}_{F1}I_{F1} + \underline{a}_{F2}I_{F2} + \underline{a}_{F0}I_{F0})\left[\frac{1}{\underline{Z}_{AA\_p} - d\underline{Z}_{1L}} + \frac{1}{\underline{Z}_{BA\_p} - (1-d)\underline{Z}_{1L}}\right] = 0 \tag{5}$$

Note that the apparent impedances measured by the relays AA and BA, which are involved in (5), are not dependent on the synchronization angle, as they are determined:

$$Z_{AA\_p} = \frac{\underline{V}_{AA\_p}e^{j\delta}}{\underline{I}_{AA\_p}e^{j\delta}} = \frac{\underline{V}_{AA\_p}}{\underline{I}_{AA\_p}} \tag{5a}$$

$$Z_{BA\_p} = \frac{\underline{V}_{BA\_p}}{\underline{I}_{BA\_p}} \tag{5b}$$

The crucial point of deriving the fault location algorithm relies in expressing the voltage drop across the fault resistance [the term: $R_F(\underline{a}_{F1}\underline{I}_{F1}+\underline{a}_{F2}\underline{I}_{F2}+\underline{a}_{F0}\underline{I}_{F0})$], which is involved in equations (3)–(5), in the following way:

$$R_F(\underline{a}_{F1}I_{F1} + \underline{a}_{F2}I_{F2} + \underline{a}_{F0}I_{F0}) = \frac{R_F}{\underline{P}_{FLT}}(I_{AA\_p}e^{j\delta} + I_{BA\_p}) \tag{6}$$

where: $\underline{P}_{FLT}$—complex coefficient dependent on the fault type (Table 3).

Figure 8:
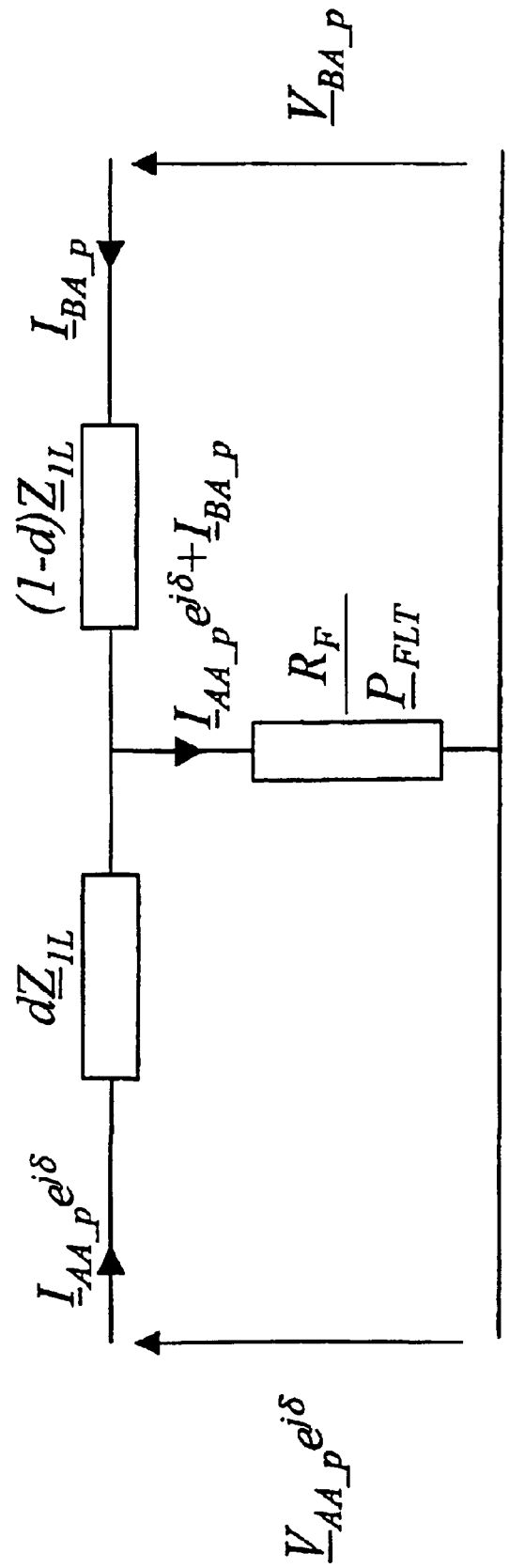
FIG. 8 shows a general fault model for unsynchronized measurements of impedance relays installed at both the line terminals.
Figure 9:
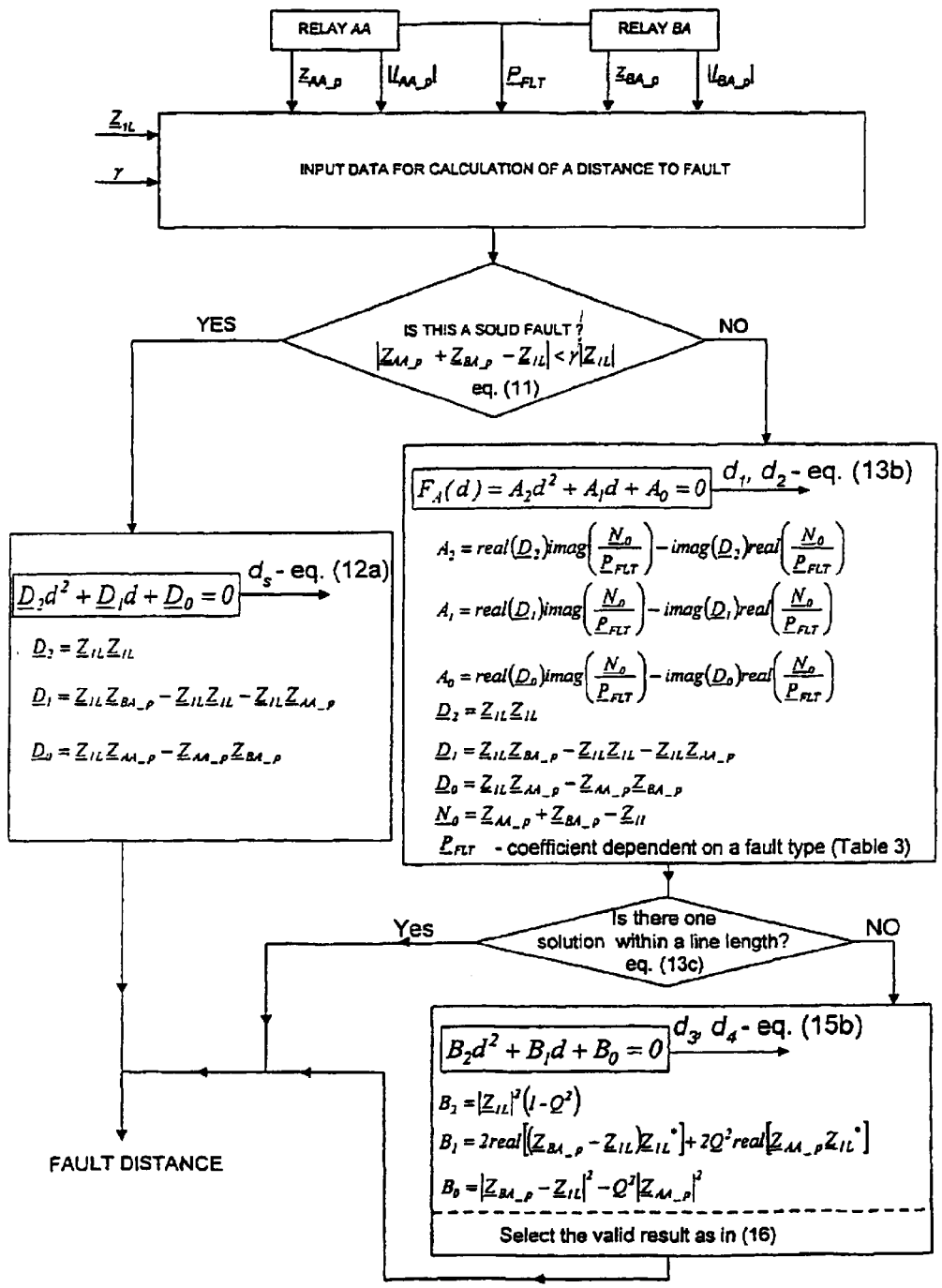
FIG. 9 shows a flow chart of the fault location algorithm according to the present invention.

In consequence a general model for unsynchronized measurements of impedance relays is obtained as presented in FIG. 8.

The right hand side of equation (6) can be interpreted as the voltage drop across the equivalent fault impedance ($R_F/\underline{P}_{FLT}$) when the sum of the relaying currents at both the line terminals ($\underline{I}_{AA\_p}e^{j\delta}$ and $\underline{I}_{BA\_p}$) flow through it.

The coefficient ($\underline{P}_{FLT}$) introduced in equation (6) can thus be determined as the following ratio:

$$\underline{P}_{FLT} = \frac{I_{AA\_p}e^{j\delta} + I_{BA\_p}}{\underline{a}_{F1}I_{F1} + \underline{a}_{F2}I_{F2} + \underline{a}_{F0}I_{F0}} \tag{7}$$

Calculation of the coefficient ($\underline{P}_{FLT}$) requires expressing the relaying currents at both the line terminals ($\underline{I}_{AA\_p}e^{j\delta}$ and $\underline{I}_{BA\_p}$) with use of the symmetrical quantities [equations (1), (2)—the coefficients see Table 1] and assuming values for the weighting coefficients ($\underline{a}_{F1}$, $\underline{a}_{F2}$, $\underline{a}_{F0}$). Table 2 below gathers three sets of these weighting coefficients excluding the zero sequence component of the fault path current ($\underline{a}_{F0}=0$). They differ in preference of using a particular component (the 1-st set prefers the negative sequence, the 2-nd prefers the positive sequence, the 3-rd has no preference).

Moreover, for determining the coefficient ($\underline{P}_{FLT}$) it is utilized (with neglecting the line shunt capacitances) that:

for any of the sequence (positive, negative and the zero sequence, respectively) the fault path current is received as a sum of the currents from both the line terminals (the first three equations of (8)) and the zero sequence components of the healthy line currents at both the stations (A and B) have opposite directions (the fourth equation of (8)):

$\underline{I}_{F1} = \underline{I}_{AA1} e^{j\delta} + \underline{I}_{BA1}$ $\underline{I}_{F2} = \underline{I}_{AA2} e^{j\delta} + \underline{I}_{BA2}$ $\underline{I}_{F0} = \underline{I}_{AA0} e^{j\delta} + \underline{I}_{BA0}$ $\underline{I}_{AB0} e^{j\delta} + \underline{I}_{BB0} = 0$           (8)

Finally, utilizing formulae (1)–(2) together with Table 1, the coefficient ($\underline{P}_{FLT}$) can be calculated with the relations of equation (8) and Table 2. Regardless of which of the sets (1-st, 2-nd or 3-rd) of weighting coefficients from Table 2 is used the coefficient ($\underline{P}_{FLT}$) is of a fixed value (complex or real number) dependent on a fault type, Table 3 below. Examples of determining the coefficient ($\underline{P}_{FLT}$) are shown in the Appendix 1.

TABLE 2

Sets of the weighting coefficients ($a_{F1}$, $a_{F2}$, $a_{F0}$) for different fault types Voltage drop across the fault path:
$V_F = R_F(a_{F1}I_{F1} + a_{F2}I_{F2} + a_{F0}I_{F0})$

| Fault type | 1-st set | | | 2-nd set | | | 3-rd set | | |
|---|---|---|---|---|---|---|---|---|---|
| | $a_{F1}$ | $a_{F2}$ | $a_{F0}$ | $a_{F1}$ | $a_{F2}$ | $a_{F0}$ | $a_{F1}$ | $a_{F2}$ | $a_{F0}$ |
| a-g | 0 | 3 | 0 | 3 | 0 | 0 | 1.5 | 1.5 | 0 |
| b-g | 0 | 3a | 0 | $3a^2$ | 0 | 0 | $1.5a^2$ | $1.5a$ | 0 |
| c-g | 0 | $3a^2$ | 0 | $3a$ | 0 | 0 | $1.5a$ | $1.5a^2$ | 0 |
| a-b | 0 | $1 - a$ | 0 | $1 - a^2$ | 0 | 0 | $0.5(1 - a^2)$ | $0.5(1 - a)$ | 0 |
| b-c | 0 | $a - a^2$ | 0 | $a^2 - a$ | 0 | 0 | $0.5(a^2 - a)$ | $0.5(a - a^2)$ | 0 |
| c-a | 0 | $a^2 - 1$ | 0 | $a - 1$ | 0 | 0 | $0.5(a - 1)$ | $0.5(a^2 - 1)$ | 0 |
| a-b-g | $1 - a^2$ | $1 - a$ | 0 | $1 - a^2$ | $1 - a$ | 0 | $1 - a^2$ | $1 - a$ | 0 |
| b-c-g | $a^2 - a$ | $a - a^2$ | 0 | $a^2 - a$ | $a - a^2$ | 0 | $a^2 - a$ | $a - a^2$ | 0 |
| c-a-g | $a - 1$ | $a^2 - 1$ | 0 | $a - 1$ | $a^2 - 1$ | 0 | $a - 1$ | $a^2 - 1$ | 0 |
| a-b-c-g (a-b-c) | $1 - a^2$ | 0 | 0 | $1 - a^2$ | 0 | 0 | $1 - a^2$ | 0 | 0 |

TABLE 3

Values of the coefficient $P_{FLT}$ for different fault types

| FAULT TYPE | a-g b-g c-g | a-b b-c c-a | a-b-g b-c-g c-a-g a-b-c a-b-c-g |
|---|---|---|---|
| $P_{FLT}$ | $\dfrac{2Z_{1L} + Z_{0L}}{3Z_{1L}}$ | 2 | 1 |

Introducing the coefficient ($\underline{P}_{FLT}$) into (5) one obtains the following quadratic equation for complex numbers:

$$\underline{D}_2 d^2 + \underline{D}_1 d + \underline{D}_0 + \frac{R_F}{\underline{P}_{FLT}} \underline{N}_0 = 0 \quad (9)$$

where:

$\underline{D}_2 = \underline{Z}_{1L}\underline{Z}_{1L}$ $\underline{D}_1 = \underline{Z}_{1L}\underline{Z}_{BA\_p} - \underline{Z}_{1L}\underline{Z}_{1L} - \underline{Z}_{1L}\underline{Z}_{AA\_p}$ $\underline{D}_0 = \underline{Z}_{1L}\underline{Z}_{AA\_p} - \underline{Z}_{AA\_p}\underline{Z}_{BA\_p}$ $\underline{N}_0 = \underline{Z}_{AA\_p} + \underline{Z}_{BA\_p} - \underline{Z}_{1L}$ There are two unknowns in (9): d—distance to a fault, $R_F$—fault resistance. Solution of (9) depends on whether a fault is solid or resistive.

For ideally solid faults it is satisfied:

$\underline{N}_0 = \underline{Z}_{AA\_p} + \underline{Z}_{BA\_p} - \underline{Z}_{1L} = 0$      (10)

It is to be observed that the condition (10) is satisfied also for any (solid or resistive) fault occurring outside a line. However, for such the outside faults the directional elements of distance relays are blocking the operation of relays.

Identification of solid faults or faults involving resistance of small value (a fraction of Ω) can be performed on the base of a condition that a right-hand side of (10) assumes also small values (in comparison to amplitude of a positive sequence impedance of a line):

$|\underline{Z}_{AA\_p} + \underline{Z}_{BA\_p} - \underline{Z}_{1L}| < \gamma |\underline{Z}_{1L}|$      (11)

where:

γ—coefficient being a small fraction (for example assuming γ=0.005 will provide accuracy of fault location of the range of 0.5%).

Thus, in the case of satisfying equation (11) a distance to a fault can be determined by solving the following quadratic equation, obtained from equation (9) by neglecting the term involving a fault resistance:

$\underline{D}_2 d^2 + \underline{D}_1 d + \underline{D}_0 = 0$      (12)

Resolving equation (12) for the real and imaginary components one obtains two quadratic equations for a fault distance in which the coefficients are real numbers. Combining these two equations the solution of equation (12) for a distance to fault, $d_s$, is obtained as:

$$d_s = \frac{-\text{real}(\underline{D}_0)\text{imag}(\underline{D}_2) + \text{imag}(\underline{D}_0)\text{real}(\underline{D}_2)}{\text{real}(\underline{D}_1)\text{imag}(\underline{D}_2) - \text{imag}(\underline{D}_1)\text{real}(\underline{D}_2)} \quad (12a)$$

where: the complex coefficients ($\underline{D}_2$, $\underline{D}_1$, $\underline{D}_0$) are defined in equation (9).

In contrary, if equation (11) is not satisfied, a fault resistance has to be taken into account for fault distance estimation. The equation (9) is for complex numbers and contains two unknowns:

d—a distance to a fault, $R_F$—fault resistance. Resolving equation (9) into two equations for real and imaginary components, respectively, results in the following quadratic equation for a sought fault distance:

$F_A(d) = A_2 d^2 + A_1 d + A_0 = 0$      (13)

where:

$A_2 = \text{real}(\underline{D}_2)\text{imag}\left(\dfrac{\underline{N}_0}{\underline{P}_{FLT}}\right) - \text{imag}(\underline{D}_2)\text{real}\left(\dfrac{\underline{N}_0}{\underline{P}_{FLT}}\right)$    (13a)

$A_1 = \text{real}(\underline{D}_1)\text{imag}\left(\dfrac{\underline{N}_0}{\underline{P}_{FLT}}\right) - \text{imag}(\underline{D}_1)\text{real}\left(\dfrac{\underline{N}_0}{\underline{P}_{FLT}}\right)$ $A_0 = \text{real}(\underline{D}_0)\text{imag}\left(\dfrac{\underline{N}_0}{\underline{P}_{FLT}}\right) - \text{imag}(\underline{D}_0)\text{real}\left(\dfrac{\underline{N}_0}{\underline{P}_{FLT}}\right)$ Equation (13), with taking equation (13a), gives two solutions for a distance to fault ($d_1$, $d_2$):

$$d_1 = \frac{-A_1 - \sqrt{A_1^2 - 4A_2 A_0}}{2A_2} \quad (13b)$$

$$d_2 = \frac{-A_1 + \sqrt{A_1^2 - 4A_2 A_0}}{2A_2}$$

If only one single solution satisfies equation (13b), then that solution indicates a fault in a line:

$$0 < (d_1 \text{ or } d_2) < 1 \text{ pu} \quad (13c)$$

then the solution satisfying (13c) is taken as the valid, while the other solution (indicating a fault outside a line) is rejected.

Thus, a fault location is performed in such cases (13c) by using only apparent impedances measured by distance relays from both the line terminals. It should be appreciated that these impedances are by nature not dependent on the synchronization angle.

In contrast, if both the solutions of equation (13b) are within a line length:

$$0 < (d_1 \text{ and } d_2) < 1 \text{ pu} \quad (13d)$$

then a problem of selecting the valid result arises.

According to the present invention such a selection is performed by utilizing information contained in amplitudes of relaying currents from both the line terminals. The ratio of amplitudes of relaying currents (Q) is related with a distance to fault (d) and measured apparent impedances ($\underline{Z}_{AA\_p}$, $\underline{Z}_{BA\_p}$) as follows:

$$Q = \left| \frac{I_{AA\_p} e^{j\delta}}{I_{BA\_p}} \right| = \left| \frac{I_{AA\_p}}{I_{BA\_p}} \right| = \left| \frac{Z_{BA\_p} - (1-d)Z_{1L}}{Z_{AA\_p} - d Z_{1L}} \right| \quad (14)$$

After some rearrangements the equation (14) transforms to the following quadratic equation (derivation is provided in APPENDIX 2):

$$F_B(d) = B_2 d^2 + B_1 d + B_0 = 0 \quad (15)$$

where:

$$B_2 = |Z_{1L}|^2 (1 - Q^2)$$

$$B_1 = 2\text{real}\{(\underline{Z}_{BA\_p} - \underline{Z}_{1L})\underline{Z}_{1L}^*\} + 2Q^2 \text{real}\{\underline{Z}_{AA\_p}\underline{Z}_{1L}^*\}$$

$$B_0 = |\underline{Z}_{BA\_p} - \underline{Z}_{1L}|^2 - Q^2 |\underline{Z}_{AA\_p}|^2 \quad (15a)$$

| | and *—denote absolute value and conjugate of a complex number, respectively.

Equation (15), taking into account equation (15a), gives two solutions for a distance to fault ($d_3$, $d_4$):

$$d_3 = \frac{-B_1 - \sqrt{B_1^2 - 4B_2 B_0}}{2B_2} \quad (15b)$$

$$d_4 = \frac{-B_1 + \sqrt{B_1^2 - 4B_2 B_0}}{2B_2}$$

The solutions, taken out of all four solutions: ($d_1$, $d_2$)—eq. (13b), ($d_3$, $d_4$)—eq. (15b), which coincide ($d_i - d_j = 0$ where: i=1 or 2, j=3 or 4) give the valid solution for the fault distance ($d_v$). In practice, there are some errors in fault distance estimation (especially due to shunt capacitances of a line, which are not included at this stage of the algorithm).

Thus, instead of the ideal condition ($d_i - d_j = 0$) the following can be applied:

if $|d_i - d_j|$ = min then $$d_v = \frac{d_i + d_j}{2} \quad (16)$$

where: i=1 or 2, j=3 or 4.

Note: the valid result ($d_v$) is taken as an average of the solutions ($d_i$, $d_j$), which coincide.

Figure 10:
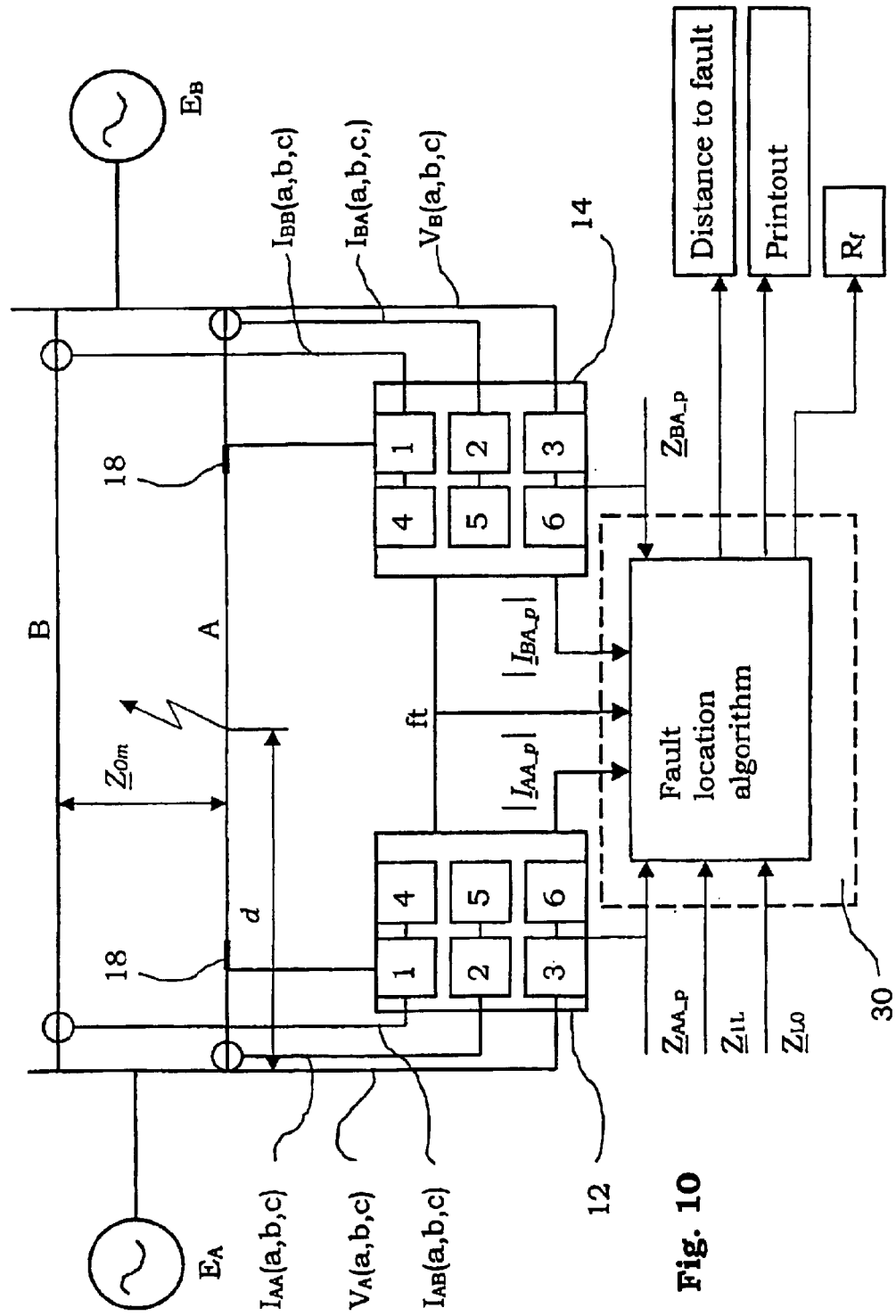
FIG. 10 shows an example of a device for performing the method of the invention.

FIG. 10 shows an embodiment of a device for determining the distance from a station, at one end of a transmission line, until the occurrence of a fault on the transmission line according to the described method. It comprises relays 12, 14 arranged at both ends of the transmission line section, where the relays shown protect line A. An equivalent set of relays is used but not shown in FIG. 10 for simplicity. Each relay comprises measuring devices 1 to 3 for continuous measurement of the voltage and currents from both lines A and B. Each relay is connected to breakers 18 for each line and is equipped with means for detecting a fault and breaking the lines. Depending on the type of relay used, it may or may not comprise further devices. If the relay is of a conventional type, it may only be able to break the lines. The measured values of the currents and voltages are in that case passed to a calculating unit 30 comprising the fault location algorithm according to the invention. The measured signals are passed through measurement converters 4 to 6. The impedance may as mentioned earlier either be determined by the calculating unit by processing the phasors. The impedance may also be determined by some other means outside the calculating unit.

For a more modern type of relay, these may also comprise measurement converters, as indicated in FIG. 10, and means for classification of the fault type. Each relay comprises electronic equipment for processing phasors of the fault loop signals whereby the impedance is determined. Each relay 12, 14 is connected to the fault location calculating unit 30 via electrical connections, and the relays provide information regarding the fault type ft, the impedance Z and the relaying currents I.

The calculating unit is provided with the calculation algorithms described, programmed for the processes needed for calculating the distance to fault and the fault resistance. The calculating unit may as mentioned above also be provided with known values such as the impedance of the line. When the calculating unit has determined the distance to fault, it is displayed on the device and/or sent to remotely located display means. A printout of the result may also be provided. In addition to signalling the fault distance, the device can produce reports, in which are recorded measured values of the currents of both lines, voltages, type of fault and other associated with a given fault at a distance.

The information in the form of a result for $d_v$ from the fault location system may also be embodied as a data signal for communication via a network to provide a basis for control action. The distance $d_v$ may be sent as a signal as a control action such as: automatic notification to operational network centres of fault and it's location or to automatically start calculations to determine journey time to location, which repair crew shall be dispatched to site, possible time taken to execute a repair, calculate which vehicles or crew member may be needed, how many shifts work per crew will be required and the like actions.

The calculating unit may comprise filters for filtering the signals, A/D-converters for converting and sampling the signals and a micro processor. The micro processor comprises a central processing unit CPU performing the following functions: collection of measured values, processing of measured values, calculation of distance to fault and output of result from calculation. The micro processor further comprises a data memory and a program memory.

A computer program for carrying out the method according to the present invention is stored in the program memory. It is to be understood that the computer program may also be run on general purpose computer instead of a specially adapted computer.

The software includes computer program code elements or software code portions that make the computer perform the said method using the equations, algorithms, data and calculations previously described. It may also be run in a distributed way over a network. A part of the program may be stored in a processor as above, but also in a RAM, ROM, PROM or EPROM chip or similar. The program in part or in whole may also be stored on, or in, other suitable computer readable medium such as a magnetic disk, CD-ROM or DVD disk, hard disk, magneto-optical memory storage means, in volatile memory, in flash memory, as firmware, or stored on a data server.

It is to be noted that the embodiment of the invention described and shown in the drawings is to be regarded as a non-limiting example of the invention and that the scope of protection is defined by the patent claims.

Appendix 1—Derivation of the Coefficient ($\underline{P}_{FLT}$)

The coefficient ($\underline{P}_{FLT}$) is defined in (7) as:

$$P_{FLT} = \frac{I_{AA\_p}e^{j\delta} + I_{BA\_p}}{\underline{a}_{F1}\underline{I}_{F1} + \underline{a}_{F2}\underline{I}_{F2} + \underline{a}_{F0}\underline{I}_{F0}} \quad (7)$$

Figure 11:
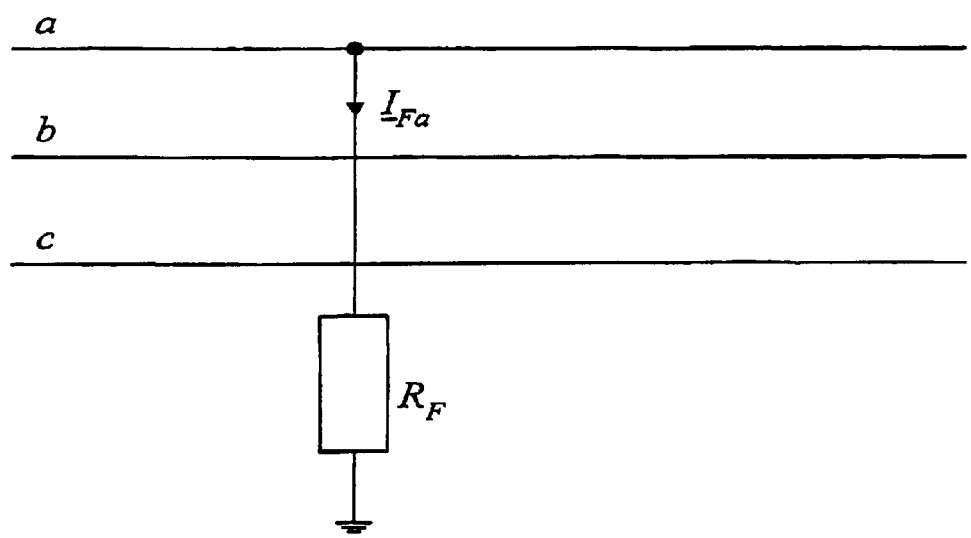
FIGS. 11–13 show models for different types of faults.

The derivation for a single phase-to-ground (a–g) fault, FIG. 10, and for a phase-to-phase fault (a–b), FIG. 11, is performed as follows.

a–g fault:
Derivation of the weighting coefficients for particular sequence components
(the 1-st set in Table 2):
Taking into account that in the healthy phases: $\underline{I}_{Fb}=\underline{I}_{Fc}=0$ gives:

$$I_{F1} = \frac{1}{3}(I_{Fa} + aI_{Fb} + a^2 I_{Fc}) = \frac{1}{3}(I_{Fa} + a0 + a^2 0) = \frac{1}{3}I_{Fa}$$

$$I_{F2} = \frac{1}{3}(I_{Fa} + a^2 I_{Fb} + aI_{Fc}) = \frac{1}{3}(I_{Fa} + a^2 0 + a0) = \frac{1}{3}I_{Fa}$$

$$I_{F0} = \frac{1}{3}(I_{Fa} + I_{Fb} + I_{Fc}) = \frac{1}{3}(I_{Fa} + 0 + 0) = \frac{1}{3}I_{Fa}$$

The sequence components are related: $\underline{I}_{F1}=\underline{I}_{F2}=\underline{I}_{F0}$
and finally: $\underline{I}_F=\underline{I}_{Fa}=3\underline{I}_{F2}$,
thus $\underline{a}_{F1}=0$, $\underline{a}_{F2}=3$, $\underline{a}_{F0}=0$ (as in Table 2)
Derivation of the coefficient $\underline{P}_{FLT}$ for a–g fault:

$$P_{FLT} = \frac{I_{AA\_p}e^{j\delta} + I_{BA\_p}}{\underline{a}_{F1}\underline{I}_{F1} + \underline{a}_{F2}\underline{I}_{F2} + \underline{a}_{F0}\underline{I}_{F0}}$$

= by using the formulas (1) and (2) we continue as follows $$= \frac{\left(a_1 I_{AA1} + a_2 I_{AA2} + a_0 \frac{Z_{0L}}{Z_{1L}} I_{AA0}\right)e^{j\delta} + }{\underline{a}_{F1}\underline{I}_{F1} + \underline{a}_{F2}\underline{I}_{F2} + \underline{a}_{F0}\underline{I}_{F0}}$$

$$\frac{\left(a_1 I_{BA1} + a_2 I_{BA2} + a_0 \frac{Z_{0L}}{Z_{1L}} I_{BA0}\right)}{\underline{a}_{F1}\underline{I}_{F1} + \underline{a}_{F2}\underline{I}_{F2} + \underline{a}_{F0}\underline{I}_{F0}} +$$

$$\frac{a_{0m}\frac{Z_{0m}}{Z_{1L}}I_{AB0}e^{j\delta} + a_{0m}\frac{Z_{0m}}{Z_{1L}}I_{BB0}}{\underline{a}_{F1}\underline{I}_{F1} + \underline{a}_{F2}\underline{I}_{F2} + \underline{a}_{F0}\underline{I}_{F0}}$$

= by using the formula (8) we continue as follows $$= \frac{a_1 I_{F1} + a_2 I_{F2} + a_0 \frac{Z_{0L}}{Z_{1L}} I_{F0}}{\underline{a}_{F1}\underline{I}_{F1} + \underline{a}_{F2}\underline{I}_{F2} + \underline{a}_{F0}\underline{I}_{F0}}$$

= by taking the coefficients from Tables 1 and 2 we continue as follows $$= \frac{I_{F1} + I_{F2} + \frac{Z_{0L}}{Z_{1L}}I_{F0}}{0I_{F1} + 3I_{F2} + 0I_{F0}}$$

$$= \frac{\left(1 + 1 + \frac{Z_{0L}}{Z_{1L}}\right)I_{F1}}{3I_{F2}}$$

$$= \frac{\left(1 + 1 + \frac{Z_{0L}}{Z_{1L}}\right)}{3}$$

$$= \frac{2Z_{1L} + Z_{0L}}{3Z_{1L}}$$

as in Table 3.
a–b fault:
Derivation of the weighting coefficients for particular sequence components
(the 1-st set in Table 2):
The fault current can be expressed as: $\underline{I}_F=\underline{I}_{Fa}$ or as:

$$I_F = \frac{1}{2}(I_{Fa} - I_{Fb})$$

Taking into account that in the healthy phase: $\underline{I}_{Fc}=0$ and for the faulted phases: $\underline{I}_{Fb}=-\underline{I}_{Fa}$, giving:

$$I_{F1} = \frac{1}{3}(I_{Fa} + aI_{Fb} + a^2 I_{Fc}) = \frac{1}{3}(I_{Fa} + a(-I_{Fa}) + a^2 0) = \frac{1}{3}(1-a)I_{Fa}$$

$$I_{F2} = \frac{1}{3}(I_{Fa} + a^2 I_{Fb} + aI_{Fc}) = \frac{1}{3}(I_{Fa} + a^2(-I_{Fa}) + a0) = \frac{1}{3}(1-a^2)I_{Fa}$$

$$I_{F0} = \frac{1}{3}(I_{Fa} + I_{Fb} + I_{Fc}) = \frac{1}{3}(I_{Fa} + (-I_{Fa}) + 0) = 0$$

The relation between $\underline{I}_{F1}$ and $\underline{I}_{F2}$ is thus:

$$\frac{I_{F1}}{I_{F2}} = \frac{\frac{1}{3}(1-a)I_{Fa}}{\frac{1}{3}(1-a^2)I_{Fa}} = \frac{(1-a)}{(1-a^2)}$$

Finally:

$$I_F = I_{Fa} = \frac{3}{(1-a^2)}I_{F2} = (1-a)I_{F2},$$

thus: $\underline{a}_{F1}=0$, $\underline{a}_{F2}=1-a$, $\underline{a}_{F0}=0$ (as in Table 2)

Derivation of the coefficient $\underline{P}_{FLT}$ for a–b fault $$\underline{P}_{FLT} = \frac{I_{AA\_p}e^{j\delta} + I_{BA\_p}}{\underline{a}_{F1}I_{F1} + \underline{a}_{F2}I_{F2} + \underline{a}_{F0}I_{F0}}$$

= as for this fault there is no zero sequence component $$= \frac{a_1 I_{F1} + a_2 I_{F2}}{a_{F1}I_{F1} + a_{F2}I_{F2}}$$

= by taking the coefficients from Tables 1 and 2 we continue $$= \frac{(1-a^2)I_{F1} + (1-a)I_{F2}}{0 I_{F1} + (1-a)I_{F2}}$$

$$= \frac{(1-a^2)\frac{I_{F1}}{I_{F2}} + (1-a)}{(1-a)}$$

= by utilizing the relation between $I_{F1}$ and $I_{F2}$ we obtain $$= \frac{(1-a^2)\frac{(1-a)}{(1-a^2)} + (1-a)}{(1-a)} = 2$$

as in Table 3.

Figure 12:
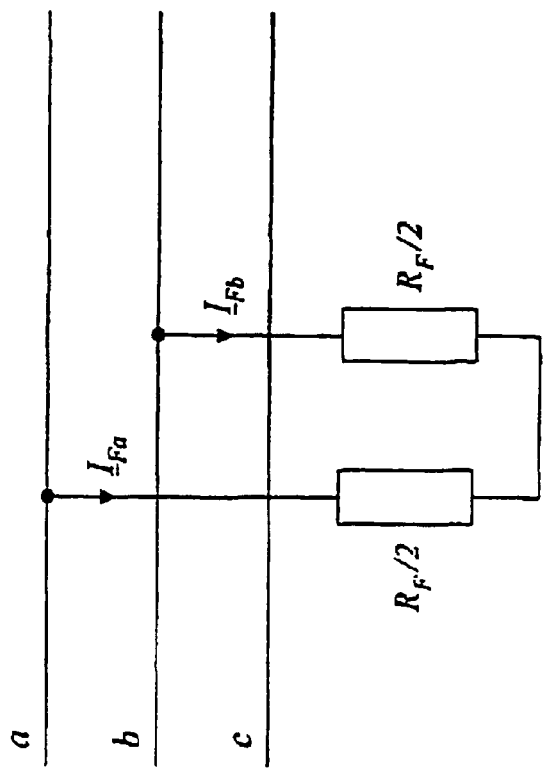
Figure 12:
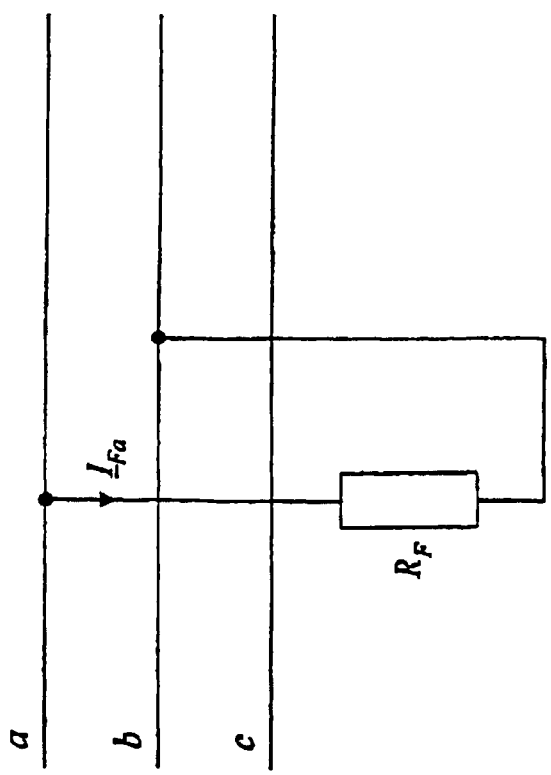
Figure 13:
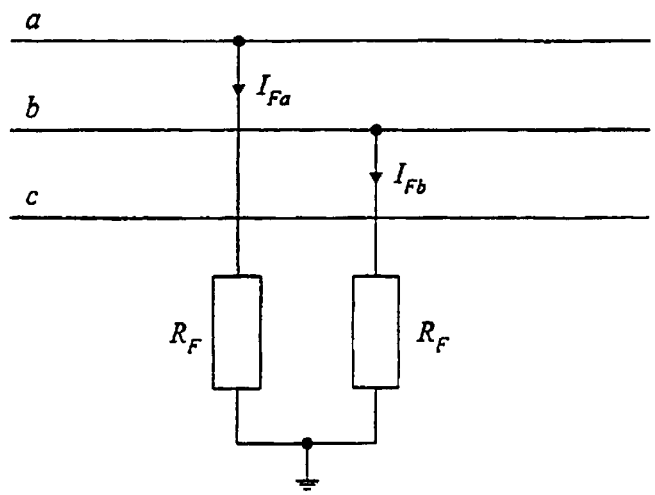
Figure 13:
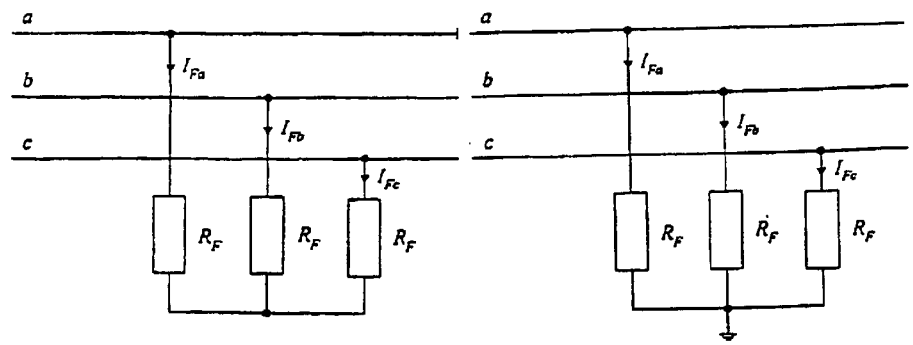

Values of the coefficient ($\underline{P}_{FLT}$) for phase-to-phase-to-ground faults and for three phase faults (Table 3) were calculated by assuming the models of these faults as in examples shown in FIG. 12.

Appendix 2—Derivation of the Coefficients in Equation (15a)

The coefficients from equation (15a), which are introduced in the quadratic equation (15) are derived as follows.

Derivation starts from eq. (14):

$$Q = \left|\frac{I_{AA\_p}e^{j\delta}}{I_{BA\_p}}\right| = \left|\frac{I_{AA\_p}}{I_{BA\_p}}\right| = \left|\frac{Z_{BA\_p} - (1-d)Z_{IL}}{Z_{AA\_p} - dZ_{IL}}\right| \quad (14)$$

Introducing:

$$\underline{Z}_{AA\_p} = R_{AA\_p} + jX_{AA\_p}$$

$$\underline{Z}_{BA\_p} = R_{BA\_p} + jX_{BA\_p}$$

$$\underline{Z}_{1L} = R_{1L} + jX_{1\_L} \quad (14a)$$

eq. (14) can be written down as:

$$Q = \left|\frac{(R_{BA\_p} - R_{IL} + dR_{IL}) + j(X_{BA\_p} - X_{IL} + dX_{IL})}{(R_{AA\_p} - dR_{IL}) + j(X_{AA\_p} - dX_{IL})}\right| \quad (14b)$$

Calculating absolute value of the right-hand side of equation (14b) and rising both the sides to the second power one obtains:

Utilizing the following relations, which are valid for any complex numbers:

$$\underline{A} = A_1 + jA_2, \quad \underline{B} = B_1 + jB_2:$$

$$\{A_1\}^2 + \{A_2\}^2 = |\underline{A}|^2 \quad (14d)$$

$$\{B_1\}^2 + \{B_2\}^2 = |\underline{B}|^2 \quad (14e)$$

$$\text{real}\{\underline{AB}^*\} = \text{real}\{(A_1+jA_2)(B_1-jB_2)\} = \text{real}\{(A_1B_1+A_2B_2)+(A_2B_1-A_1B_2)\} = A_1B_1+A_2B_2 \quad (14f)$$

where:

$\underline{X}^*$ denotes conjugate of $\underline{X}$, $|\underline{X}|$ denotes absolute value of X, eq. (14c) yields to the equation (15):

$$F_B(d) = B_2 d^2 + B_1 d + B_0 = 0 \quad (15)$$

where:

$$B_2 = |\underline{Z}_{1L}|^2(1-Q^2)$$

$$B_1 = 2\text{real}\{(\underline{Z}_{BA\_p} - \underline{Z}_{1L})\underline{Z}_{1L}^*\} + 2Q^2\text{real}\{\underline{Z}_{AA\_p}\underline{Z}_{1L}^*\} \quad (15a)$$

$$B_0 = |\underline{Z}_{BA\_p} - \underline{Z}_{1L}|^2 - Q^2|\underline{Z}_{AA\_p}|^2$$

What is claimed is:

1. Method for calculating the distance to fault in a section of a power transmission network (AA–BB), which section is arranged with line terminals at both ends, each terminal comprising impedance relays (AA, BB), comprising the steps of, at the occurrence of a fault:

measuring the apparent impedances by each relay ($\underline{Z}_{AA\_p}$, $\underline{Z}_{BA\_p}$), measuring the relaying currents ($|\underline{I}_{AA\_p}|$, $|\underline{I}_{BA\_p}|$), determining the type of fault, characterised in checking whether the fault involves a fault resistance or not according to $$|\underline{Z}_{AA\_p} + \underline{Z}_{BA\_p} - \underline{Z}_{1L}| < \gamma |\underline{Z}_{1L}|$$

where $\underline{Z}_{1L}$—impedance of a whole line for the positive sequence

γ—small fraction coefficient <0,01, and, if fulfilled, solving a quadratic equation for complex numbers according to $$\underline{D}_2 d^2 + \underline{D}_1 d + \underline{D}_0 = 0$$

where $\underline{D}_2$, $\underline{D}_1$, $\underline{D}_0$ are complex coefficients, resolving the quadratic equation for the real and imaginary components obtaining two quadratic equations for a fault distance in which the coefficients are real numbers, combining the two equations and obtaining a distance to fault as:

$$Q^2 = \frac{\{R_{IL}^2 + X_{IL}^2\}d^2 + \{2R_{IL}(R_{BA\_p} - R_{IL}) + 2X_{IL}(X_{BA\_p} - X_{IL})\}d + \{(R_{BA\_p} - R_{IL})^2 + (X_{BA\_p} - X_{IL})^2\}}{\{R_{IL}^2 + X_{IL}^2\}d^2 - \{2R_{IL}R_{AA\_p} + 2X_{IL}X_{AA\_p}\}d + \{R_{AA\_p}^2 + X_{AA\_p}^2\}} \quad (14c)$$

$$d_s = \frac{-\text{real}(\underline{D}_0)\text{imag}(\underline{D}_2) + \text{imag}(\underline{D}_0)\text{real}(\underline{D}_2)}{\text{real}(\underline{D}_1)\text{imag}(\underline{D}_2) - \text{imag}(\underline{D}_1)\text{real}(\underline{D}_2)}$$

or, if not fulfilled solving a quadratic equation for real numbers according to $$F_A(d) = A_2 d^2 + A_1 d + A_0 = 0$$

obtaining two solutions for the distance to fault according to $$d_1 = \frac{-A_1 - \sqrt{A_1^2 - 4A_2 A_0}}{2A_2}$$

$$d_2 = \frac{-A_1 + \sqrt{A_1^2 - 4A_2 A_0}}{2A_2}$$

comparing the solutions as $$0 < (d_1 \text{ or } d_2) < 1 pu$$

where pu is the length of transmission lines between the line terminals.

2. Method according to claim 1, characterised in the further steps, if the comparison $0 < (d_1$ and $d_2) < 1$ pu is fulfilled:

utilizing information contained in the amplitudes of relaying currents from both line terminals according to $$Q = \left| \frac{I_{AA\_p} e^{j\delta}}{I_{BA\_p}} \right| = \left| \frac{I_{AA\_p}}{I_{BA\_p}} \right| = \left| \frac{Z_{BA\_p} - (1-d)Z_{IL}}{Z_{AA\_p} - dZ_{IL}} \right|,$$

solving a quadratic equation according to $$F_B(d) = B_2 d^2 + B_1 d + B_0 = 0$$

where:

$$B_2 = |\underline{Z}_{1L}|^2 (1 - Q^2)$$

$$B_1 = 2\text{real}\{(\underline{Z}_{BA\_p} - \underline{Z}_{1L})\underline{Z}_{1L}^*\} + 2Q^2 \text{real}\{\underline{Z}_{AA\_p}\underline{Z}_{1L}^*\}$$

$$B_0 = |\underline{Z}_{BA\_p} - \underline{Z}_{1L}|^2 - Q^2 |\underline{Z}_{AA\_p}|^2,$$

where | | and *—denote absolute value and conjugate of a complex number, respectively, obtaining two two solutions for a distance to fault ($d_3$, $d_4$):

$$d_3 = \frac{-B_1 - \sqrt{B_1^2 - 4B_2 B_0}}{2B_2}$$

$$d_4 = \frac{-B_1 + \sqrt{B_1^2 - 4B_2 B_0}}{2B_2}$$

comparing all four solutions: ($d_1$, $d_2$, $d_3$, $d_4$) which coincide with ($d_i - d_j = 0$ where: i=1 or 2, j=3 or 4), thereby obtaining the valid solution for the fault distance ($d_v$).

3. Method according to claim 2, characterised in the further step for taking into consideration of shunt capacitances of a line, comprising performing:

if $|d_i - d_j| = \min$ then $$d_v = \frac{d_i + d_j}{2}$$

where: i=1 or 2, j=3 or 4.

4. Device for calculating the distance to fault in a section of a power transmission network, which section is arranged with line terminals at both ends, each terminal comprising impedance relays (AA, BB), comprising:

means for measuring the apparent impedances by each relay ($\underline{Z}_{AA\_p}$, $\underline{Z}_{BA\_p}$), means for measuring the relaying currents ($|\underline{I}_{AA\_p}|$, $|\underline{I}_{BA\_p}|$), means determining the type of fault, means for checking whether the fault involves a fault resistance or not according to $$|\underline{Z}_{AA\_p} + \underline{Z}_{BA\_p} - \underline{Z}_{1L}| < \gamma |\underline{Z}_{1L}|$$

where $\underline{Z}_{1L}$—impedance of a whole line for the positive sequence,

/γ—small fraction coefficient<0,01, and, if fulfilled, means for solving a quadratic equation for complex numbers according to $$\underline{D}_2 d^2 + \underline{D}_1 d + \underline{D}_0 = 0$$

where $\underline{D}_2$, $\underline{D}_1$, $\underline{D}_0$ are complex coefficients, means for resolving the quadratic equation for the real and imaginary components means for obtaining two quadratic equations for a fault distance in which the coefficients are real numbers, means for combining the two equations and obtaining a distance to fault as:

$$d_s = \frac{-\text{real}(\underline{D}_0)\text{imag}(\underline{D}_2) + \text{imag}(\underline{D}_0)\text{real}(\underline{D}_2)}{\text{real}(\underline{D}_1)\text{imag}(\underline{D}_2) - \text{imag}(\underline{D}_1)\text{real}(\underline{D}_2)}$$

or, if not fulfilled means for solving a quadratic equation for real numbers according to $$F_A(d) = A_2 d^2 + A_1 d + A_0 = 0$$

means for obtaining two solutions for the distance to fault according to $$d_1 = \frac{-A_1 - \sqrt{A_1^2 - 4A_2 A_0}}{2A_2}$$

$$d_2 = \frac{-A_1 + \sqrt{A_1^2 - 4A_2 A_0}}{2A_2}$$

means for comparing the solutions as $$0 < (d_1 \text{ or } d_2) < 1 pu$$

where pu is the length of transmission lines between the line terminals.

5. Use of a device according to claim 4 to determine the distance to fault in a single transmission line.

6. Use of a device according to claim 4 to determine the distance to fault in parallel mutually coupled transmission line.

* * * * *